(12) United States Patent
Cook et al.

(10) Patent No.: US 11,355,414 B2
(45) Date of Patent: Jun. 7, 2022

(54) NANOPARTICLE MATRIX FOR BACKSIDE HEAT SPREADING

(71) Applicant: Texas Instruments Incorporated, Dallas, TX (US)

(72) Inventors: Benjamin Stassen Cook, Addison, TX (US); Nazila Dadvand, Richardson, TX (US); Daniel Lee Revier, Dallas, TX (US); Archana Venugopal, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 136 days.

(21) Appl. No.: 16/586,720

(22) Filed: Sep. 27, 2019

(65) Prior Publication Data

US 2021/0098331 A1    Apr. 1, 2021

(51) Int. Cl.
| | |
|---|---|
| *H01L 23/373* | (2006.01) |
| *H01L 23/00* | (2006.01) |
| *H01L 23/498* | (2006.01) |
| *H01L 21/48* | (2006.01) |
| *H01L 21/285* | (2006.01) |

(52) U.S. Cl.
CPC .... *H01L 23/3735* (2013.01); *H01L 21/28556* (2013.01); *H01L 21/4871* (2013.01); *H01L 23/3733* (2013.01); *H01L 23/49811* (2013.01); *H01L 24/48* (2013.01); *H01L 2224/48227* (2013.01)

(58) Field of Classification Search
None
See application file for complete search history.

(56) References Cited

U.S. PATENT DOCUMENTS

| | | | |
|---|---|---|---|
| 9,698,075 B2 * | 7/2017 | Venugopal | ............ H01L 23/367 |
| 2015/0076649 A1 | 3/2015 | Kim et al. | |
| 2015/0310954 A1 | 10/2015 | Liu et al. | |
| 2016/0322277 A1 | 11/2016 | Venugopal et al. | |
| 2018/0151464 A1 | 5/2018 | Cook et al. | |

OTHER PUBLICATIONS

Search Report for PCT/US2020/053080, dated Dec. 3, 2020, 1 page.

* cited by examiner

*Primary Examiner* — Robert K Carpenter
(74) *Attorney, Agent, or Firm* — Valerie M. Davis; Charles A. Brill; Frank D. Cimino

(57) ABSTRACT

In described examples, a circuit (e.g., an integrated circuit) includes a semiconductor substrate that includes a frontside surface and a backside surface. A circuit element is included at the frontside surface. An optional electrical insulator layer can be included adjacent to the backside surface. A distributor layer is included adjacent to the backside surface. In some examples, the distributor layer includes a distributor material that includes a matrix of cohered nanoparticles and metallic particles embedded by the cohered nanoparticles.

20 Claims, 9 Drawing Sheets

NANOPARTICLE MATRIX FOR BACKSIDE HEAT SPREADING

BACKGROUND

Electronic systems (including electromechanical and microelectromechanical systems) include components that can generate heat. For example, such components can be electronic circuits, which can be formed as integrated circuits (e.g., dies) that generate heat during operation. Such heat can be dissipated by thermal conduction through a die package that includes the integrated circuit generating the heat. As feature sizes of integrated circuits decrease (and the complexities and operating frequencies of the circuits included on the integrated circuit increase), the thermal densities of heat generation of the integrated circuit increase. The increase in thermal densities can lead to higher operating temperatures and decreased operating life of the integrated circuit.

SUMMARY

In described examples, a circuit (e.g., an integrated circuit) includes a semiconductor substrate that includes a frontside surface and a backside surface. A circuit element is included at the frontside surface. An optional electrical insulator layer can be included adjacent to the backside surface. A distributor layer is included adjacent to the backside surface. In some examples, the distributor layer includes a distributor material that includes a matrix of cohered nanoparticles and metallic particles embedded by the cohered nanoparticles.

DETAILED DESCRIPTION

Figure 1A:
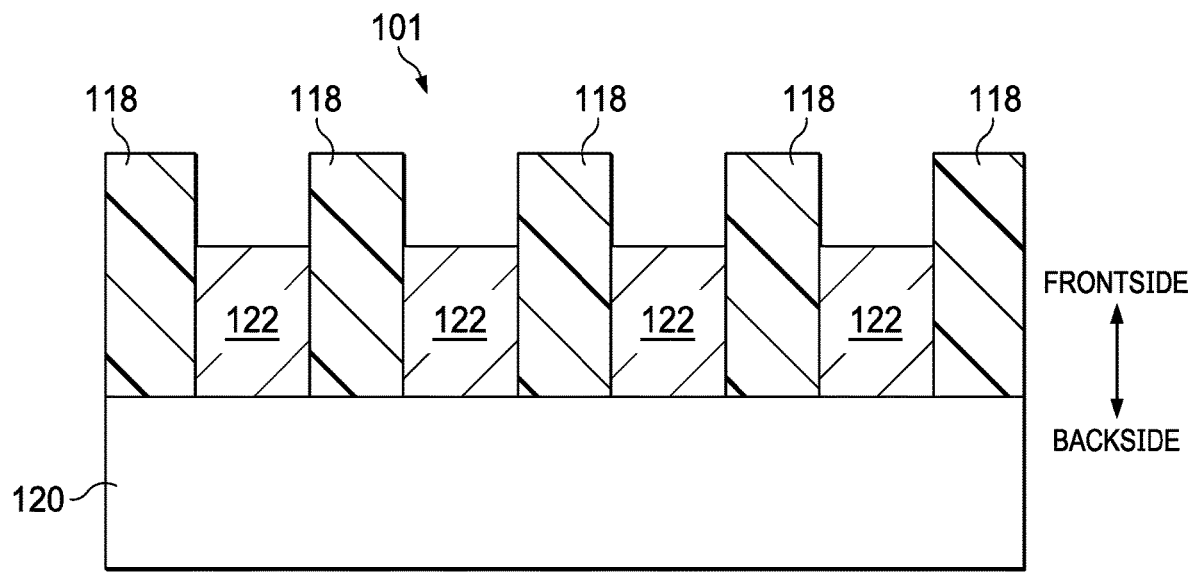
FIG. 1A is a section view of an example wafer assembly including exposed circuit elements formed in cavities of a semiconductor substrate.

In the drawings, like reference numerals refer to like elements, and the various features are not necessarily drawn to scale.

Integrated circuits include electronic circuits, which generate heat during operation. The generated heat can be dissipated by thermal conduction through a die package that includes the integrated circuit generating the heat. The dissipation of the generated heat can be enhanced by relatively expensive processes such as forming a metal surface (e.g., that includes layers of copper and titanium-tungsten) onto a backside surface of the integrated circuit. The metal surface improves the transfer of heat from the electronic circuits (which generate the heat) to the die package (which dissipates the heat). The metals used to plate the backside surface of the integrated surface can include expensive materials and involve complex processing steps. The metal layer can be formed more closely to the circuits by reducing the depth (e.g., by grinding) of the backside of the semiconductor wafer before the metal is disposed on the backside of the semiconductor wafer.

For example, dicing (e.g., singulation) of dies on a semiconductor wafer (e.g., semiconductor substrate) can include forming a patterned photoresist on the backside of the metal plating. The metal deposition is patterned with a photo resist, so that the metal plating exposed by the patterned photoresist can be removed with a chemical etching process. Removal of the exposed metal plating forms channels, through which exposed backside portions of the semiconductor wafer can be removed. A dicing tape can be applied to the backside surface of the grown semiconductor wafer (e.g., applied to the patterned photoresist layer). The dies are separated (e.g., diced, or singulated) from the frontside by removing a frontside glass carrier and cutting through the now-exposed adhesive layer to reach the exposed channels of the backside of the grown wafer. The separated dies can be handled in subsequent processing steps by manipulating the dicing tape.

In example circuits (e.g., integrated circuits) and methods (e.g., processes) described hereinbelow, a distributor layer that includes metallic particles (e.g., nanoparticles, such as graphene) can be formed (e.g., printed) onto the backside of semiconductor substrate. The described distributor layer (e.g., a backside metallization of graphene embedded nanoparticles) allows for a relatively low-cost deposition of a backside metallization. The distributor layer includes platelets of a graphitic material (e.g., which includes aromatic hydrocarbons, and which is a material having a relatively high thermal conductivity). The distributor layer is thermally conductive, so that the distributor layer can be arranged as a thermal path between an integrated circuit and die substrate (e.g., die package), for example, which can reduce circuit failures resulting from overheating. The distributor layer is electrically conductive, so that the distributor layer can provide a low resistivity path for coupling power to a circuit element formed in the semiconductor substrate (for example). Lower operating temperatures (e.g., resulting from efficient heat transfer) and decreased current densities (e.g., resulting from using space otherwise occupied by conventional cooling structures) of wider circuit structures can reduce potential failures resulting from electromigration.

FIG. 1A is a section view of an example wafer assembly including exposed circuit elements formed in cavities of a semiconductor substrate. For example, the wafer assembly 101 includes a semiconductor wafer (e.g., semiconductor substrate 120) and circuit elements 122 (e.g., elements for generating and/or conducting heat). The semiconductor substrate 120 can include (e.g., can be) a semiconductor material such as silicon, silicon germanium, silicon carbide, gallium nitride or gallium arsenide. The semiconductor substrate 120 includes a frontside surface and a backside surface.

The wafer assembly 101 is shown at a stage of the manufacturing process where the circuit elements 122 have been arranged in channels formed adjacent to (e.g., on, in or through) the semiconductor substrate 120. The circuit elements can include portions of active circuit components or passive circuit components, where the passive or active circuit components are capable of generating (or otherwise conducting) heat.

The channels can be formed by selectively etching (e.g., photographically patterned) portions of a photoresist 118 in the frontside of the semiconductor substrate 120. The circuit elements 122 have been formed in the channels of the semiconductor substrate 120, so that the circuit elements 122 have an exposed frontside portion at the frontside surface.

Figure 1B:
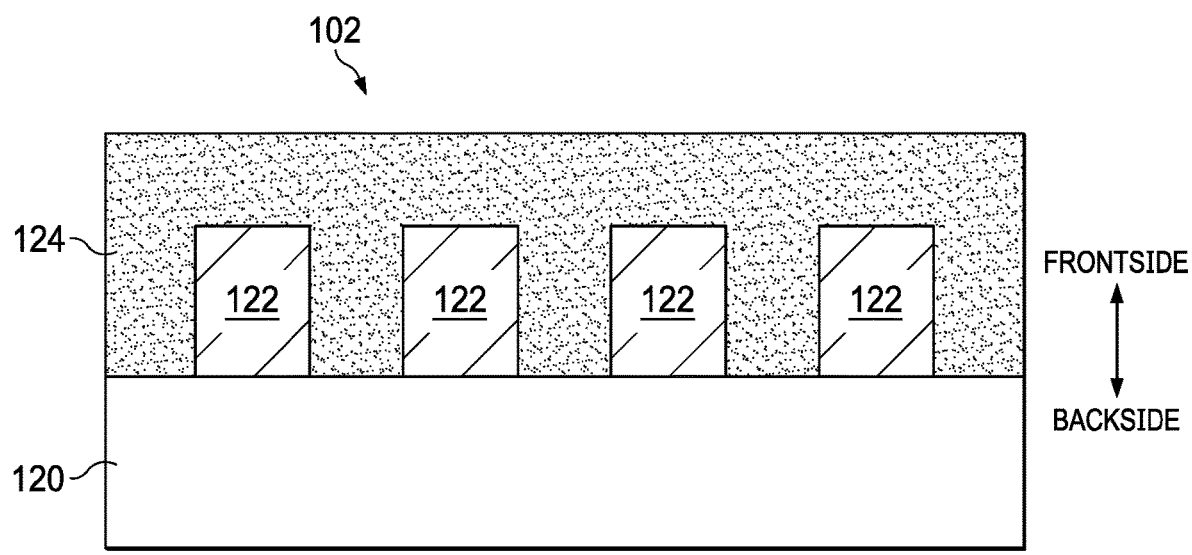
FIG. 1B is a section view of an example wafer assembly including a frontside adhesion layer.

FIG. 1B is a section view of an example wafer assembly including a frontside adhesion layer. For example, the remaining portions of the photoresist 118 can be removed (e.g., by etching) to expose the frontside of the semiconductor substrate 120, so that the adhesion layer 124 can be deposited on (e.g., in contact with) or over the frontside of the semiconductor substrate 120 and the circuit elements 122. The adhesion layer 124 extends between and over the exposed frontside portion of the circuit elements 122. In addition to providing a removable interface for mounting a temporary device carrier, the adhesion layer 124 can be used, for example, to protect organic polymers in circuit elements 122 during subsequent manufacturing process that can include potentially damaging chemicals (e.g., for etching) or free particles (e.g., produced by grinding and/or polishing processes).

Figure 1C:
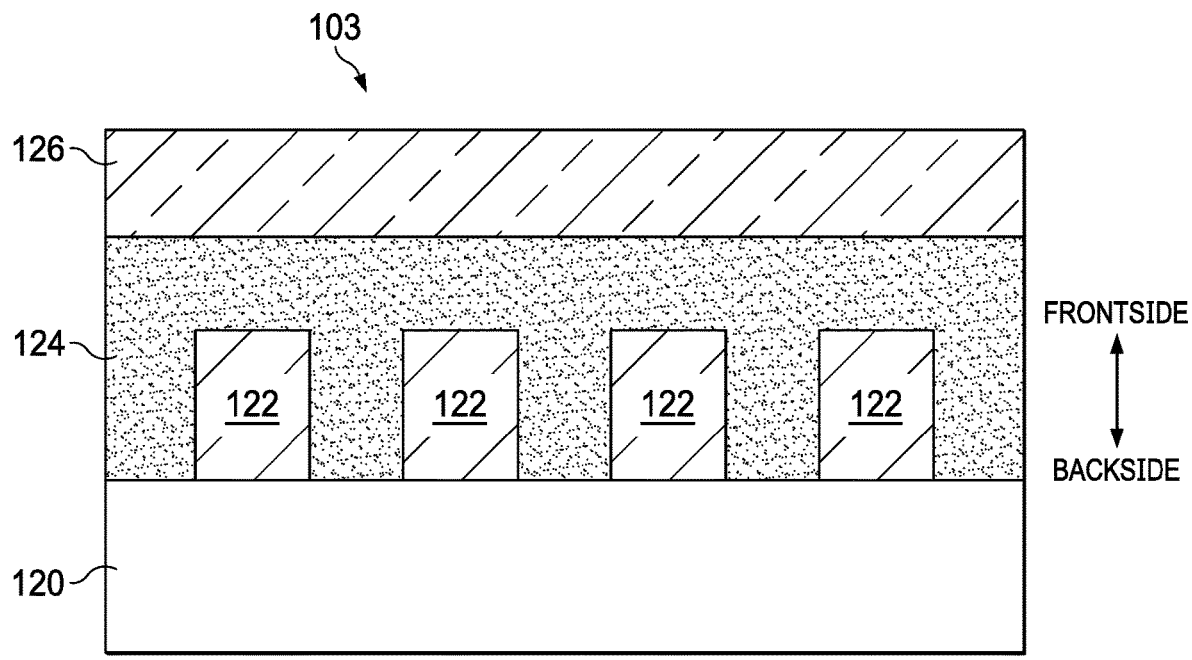
FIG. 1C is a section view of an example wafer assembly including a frontside glass carrier.

FIG. 1C is a section view of an example wafer assembly including a frontside glass carrier. For example, the wafer assembly 103 includes a glass carrier 126 mounted on the adhesive layer 124. The glass carrier 126 adheres to the frontside of the adhesion layer 124, which allows (for example) easier manipulation of the wafer assembly in subsequent processing activities by machines that manipulate the glass carrier 126. The glass carrier 126 is transparent, which facilitates a subsequent laser debonding of the glass carrier 126 from the adhesion layer 124, for example. In one example, the glass carrier 126 and an adhesive (e.g., rather than the adhesion layer 124) can be combined into an adhesive tape that is adhered to the frontside surfaces of the circuit elements 122.

Figure 1D:
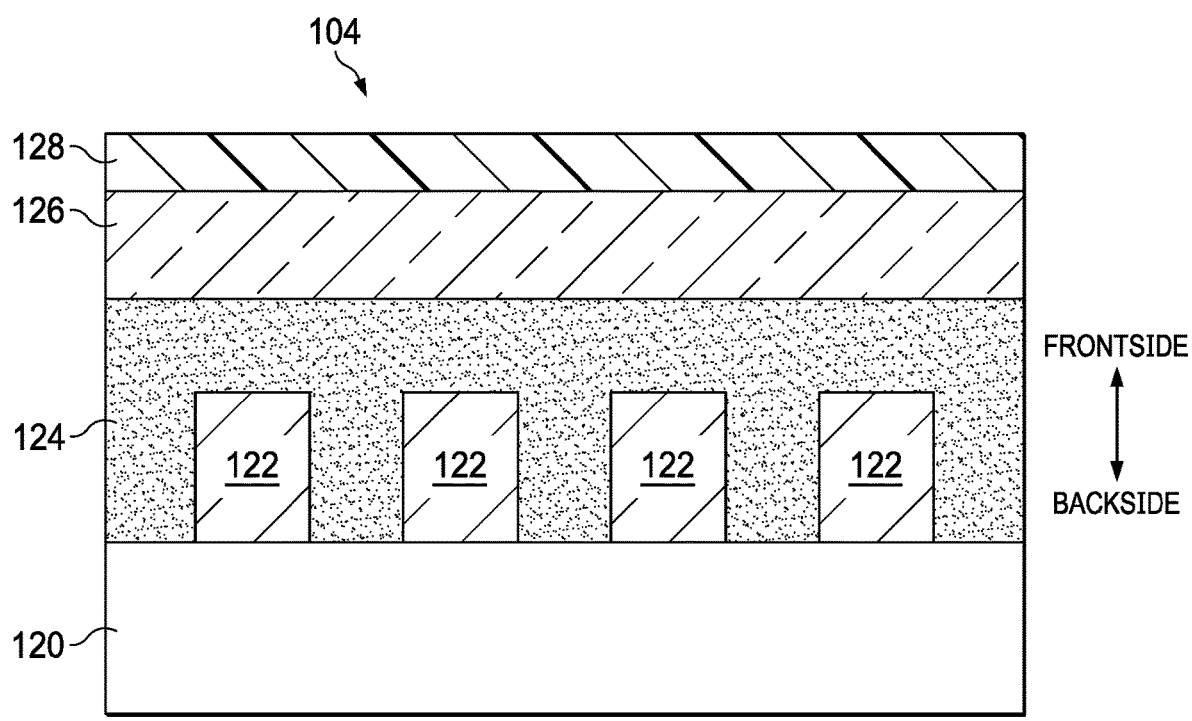
FIG. 1D is a section view of an example wafer assembly including a grinding tape.

FIG. 1D is a section view of an example wafer assembly including a grinding tape. For example, the wafer assembly 104 includes a grinding tape 128 (e.g., grinding tape 128 layer) mounted on the glass carrier 126. The grinding tape 128 adheres to the frontside of the glass carrier 126. The grinding tape 128 can include an adhesive disposed on front and back surfaces of the mounted tape, so that (for example) the frontside of the wafer assembly 104 can be affixed (e.g., removably affixed) to a substrate or workstation fixture for application of further subsequent processing operations, such as grinding.

Figure 1E:
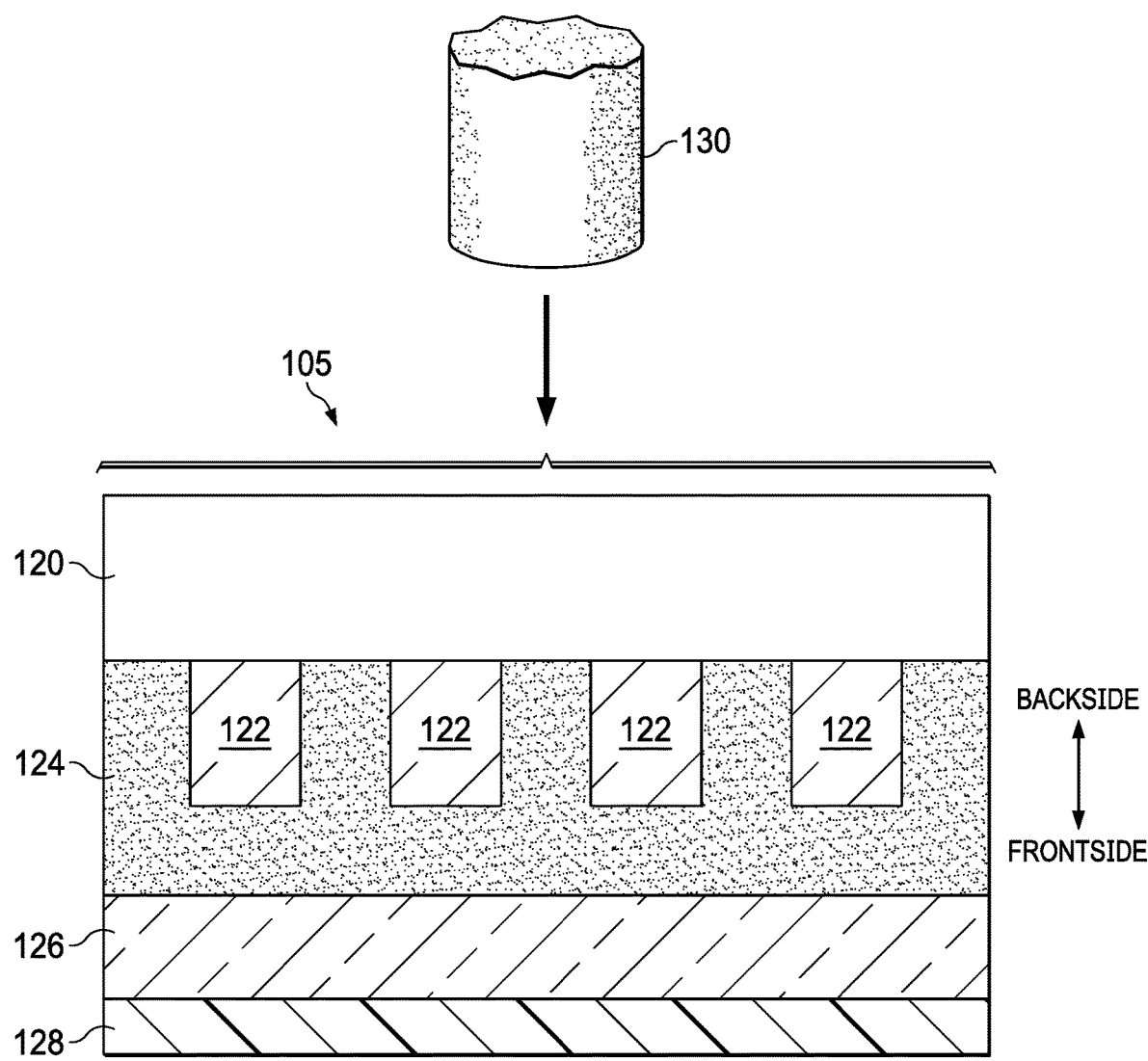
FIG. 1E is a section view of an example wafer assembly arranged for a grinding operation.

FIG. 1E is a section view of an example wafer assembly arranged for a grinding operation. For example, the wafer assembly 105 is inverted (e.g., physically flipped over), so that the backside of the semiconductor substrate 120 is exposed to a grinding edge of a grinder 130. In operation, the grinder 130 is arranged to reduce the thickness of the semiconductor substrate 120, so that the distance from the backside surface of the circuit elements 122 to the backside surface (e.g., exposed surface) of the semiconductor substrate 120 is reduced (e.g., to a remaining thickness lower than 500 nanometers: such as 20 nanometers in one example).

Figure 1F:
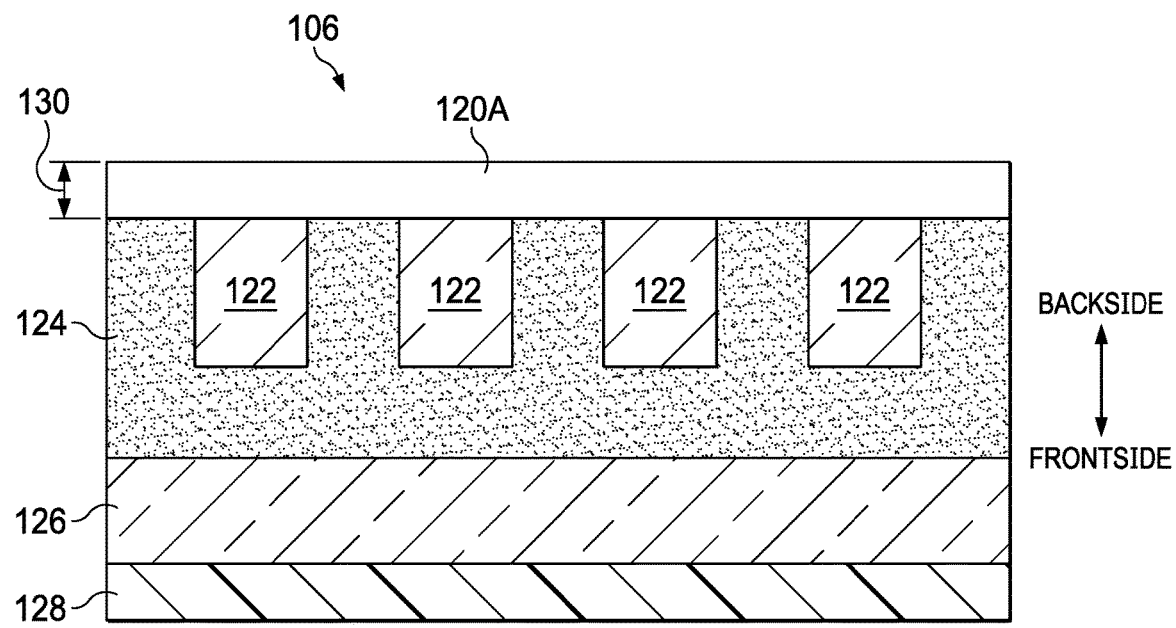
FIG. 1F is a section view of an example wafer assembly including a reduced thickness semiconductor wafer.

FIG. 1F is a section view of an example wafer assembly including a reduced thickness semiconductor wafer. For example, the wafer assembly 106 includes a reduced distance from the backside surface of the circuit elements 122 to the backside surface (e.g., exposed surface) of the semiconductor substrate 120A is reduced. The semiconductor substrate 120A can be formed by reducing (e.g., by planarization) the thickness of the semiconductor substrate 120. Reducing the distance from the backside surface of the circuit elements 122 to the backside surface of the semiconductor substrate 120A reduces the length of the thermal path that existed within the semiconductor substrate 120. Reducing the length of the thermal path can improve the rate of heat conduction (e.g., for thermal dissipation) of the semiconductor substrate 120A (e.g., as compared against the semiconductor substrate 120, which has an unreduced thickness).

Figure 1G:
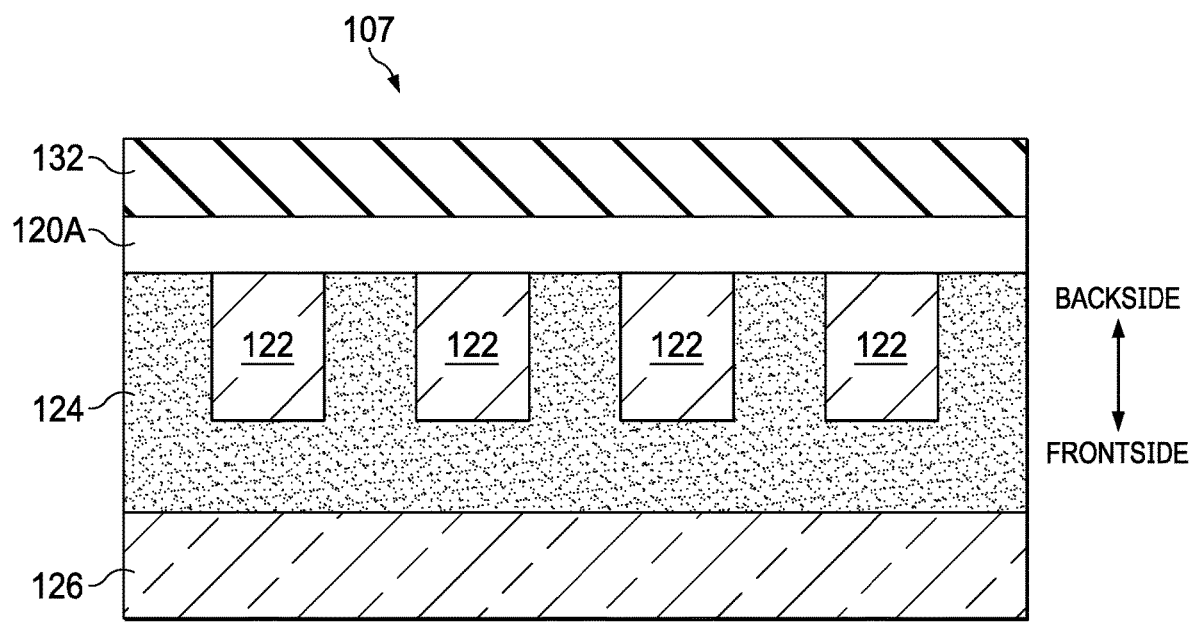
FIG. 1G is a section view of an example wafer assembly including a backside electrical insulator.

FIG. 1G is a section view of an example wafer assembly including a backside electrical insulator. For example, the wafer assembly 107 includes an electrical insulator 132, such as BN (e.g., boron nitride) or diamond (e.g., crystalline carbon) formed on the backside of the semiconductor substrate 120A. In a first example, the electrical insulator 132 can be formed by forming a film (e.g., thin film) of dielectric material on the exposed surface of the semiconductor substrate 120A by a chemical vapor deposition (CVD) process such as an atmospheric pressure chemical vapor deposition (APCVD) process or by a plasma-enhanced chemical vapor deposition (PECVD) process. In a second example, the electrical insulator 132 can be formed by a physical vapor deposition process (PVD) such as sputtering. The electrical insulator 132 can be formed having a thickness of less than 500 nanometers (e.g., having a thickness of 10 nanometers in one example).

The electrical insulator 132 is an electrical insulator (so that electrons are blocked from flowing from the semiconductor substrate 120A through the electrical insulator 132). In various examples, the electrical insulator 132 can be omitted (e.g., the electrical insulator 132 is optional), so that the distributor layer 134 (described hereinbelow) can be formed adjacent to (e.g., in contact with) the exposed surface of the semiconductor substrate 120A. For example, forming the distributor layer 134 more closely to (e.g., including in contact with) the exposed surface of the semiconductor substrate 120A can shorten a thermal path, which can enhance cooling rates. When the electrical insulator 132 is included in an example, the electrical insulator layer 132 can be arranged between the backside surface of the semiconductor substrate 120A and the distributor layer.

The grinding tape 128 can be removed from a workplace fixture (not shown) to free the wafer assembly 107 to be moved to another location (e.g., relatively clean location) for further processing. The grinding tape 128 can be removed from the frontside of the glass carrier 126, for example, to expose the frontside of the glass carrier 126 for further subsequent processing operations, such as debonding (e.g., laser debonding) of the glass carrier 126.

Figure 1H:
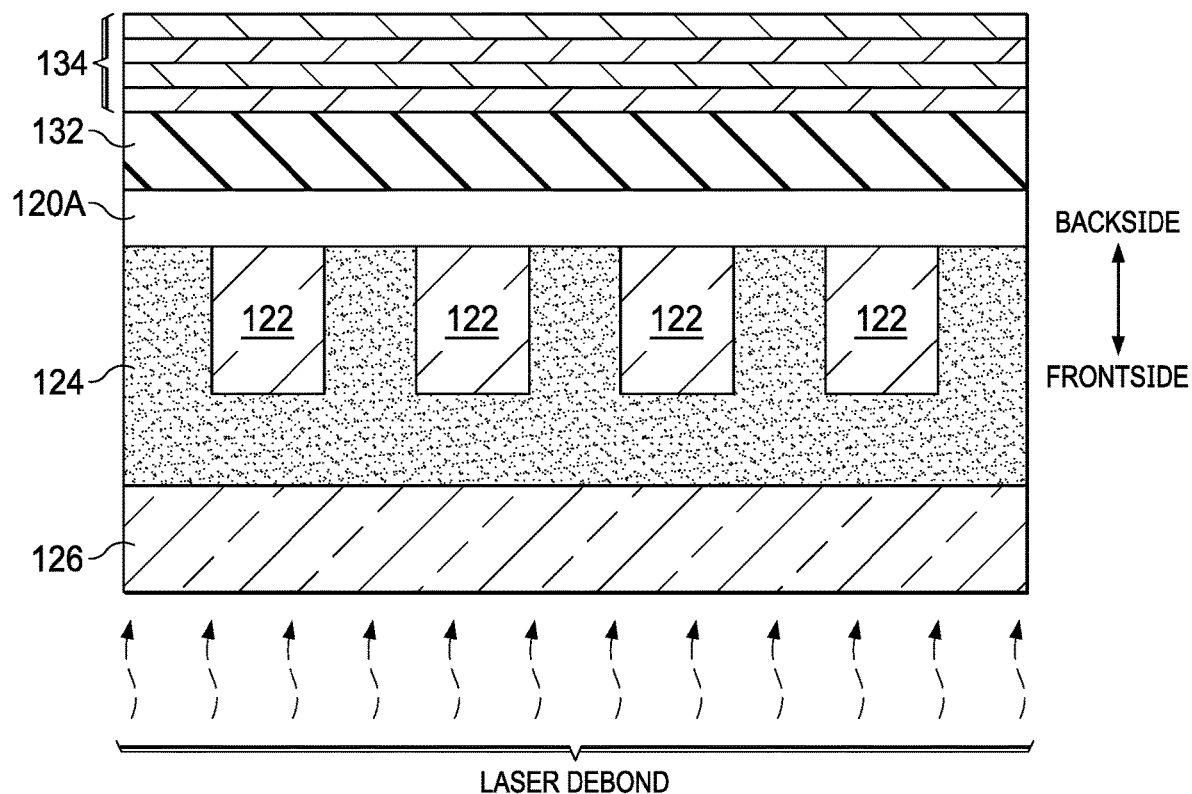
FIG. 1H is a section view of an example wafer assembly including a backside distributor layer.

FIG. 1H is a section view of an example wafer assembly including a backside distributor layer. For example, the wafer assembly 108 includes an distributor layer 134 formed on the backside of the electrical insulator 132. The distributor layer 134 can include cohered nanoparticle materials, such as graphene formed as graphene platelets arranged in a matrix of cohered nanoparticles and metallic particles embedded by the cohered nanoparticles, where the metallic particles can be silver (e.g., Ag) particles.

Examples of the formation of suitable cohered nanoparticle materials are described in the commonly assigned U.S. Patent Application Publication US 2018/0151464, published May 31, 2018, entitled Thermal Routing Trench by Additive Processing, the entirety of which is incorporated herein by reference.

The distributor layer 134 can be formed by at least one iteration of a nanoparticle film formation process (e.g., that includes deposition, volatile material removal and nanoparticle cohesion inducement, described hereinbelow). A selected thickness for the distributor layer 134 can be obtained by selecting the number of iterations of the nanoparticle film formation process performed to form the distributor layer 134 (e.g., in which an iteration forms a sublayer that can be overlaid with a subsequently formed sublayer). Additionally, a selected degree of induced nanoparticle cohesion can be selected for a selected sublayer (as described hereinbelow) by varying the times and durations of selected temperatures of a heat treatment profile.

In a first iteration of a nanoparticle film formation process for forming a distributor layer 134, a film of nanoparticle ink is deposited: by a dispenser such as a travelling nozzle (e.g., for ejecting discrete droplets of nanoparticle ink); by a continuous extrusion process; by a direct laser transfer process; by an electrostatic deposition process; and/or by an electrochemical deposition process. The deposition of the nanoparticle ink can be an additive process in which the nanoparticle ink is deposited in selected areas (e.g., to the exclusion of non-selected areas) of the exposed surface (e.g., backside) of the electrical insulator 132. The nanoparticle ink includes nanoparticles and a carrier fluid (e.g., in which the carrier fluid can include volatile material) and metallic particles (e.g., Ag). In various examples, the size of each of the metallic particles is less than a few microns, so that (for example) the metallic particles can flow as a constituent of the dispensed ink.

After the deposition of nanoparticle ink film in the first iteration of the nanoparticle film formation process, the wafer assembly 108 can be heated by a bake process, which removes at least a portion of a volatile material from the nanoparticle ink film. The removal of the volatile material from the nanoparticle ink film helps transform the nanoparticle ink film into a nanoparticle film, which includes primarily nanoparticles. In one example, the bake process can be a radiant heat process that includes, for example, an incandescent light source or infrared (IR) light emitting diodes (LEDs). In another example, the bake process can be a hot plate process during which a hot plate heats the first nanoparticle ink film 244 through the substrate 202. In various examples, the bake process can be performed in a partial vacuum (or in an ambient environment in which a continuous flow of gas is applied) at low pressure, which enhances removal of the volatile material from the nanoparticle ink film.

After the deposition of nanoparticle ink film in the first iteration of the nanoparticle film formation process, the wafer assembly 108 can be treated by a cohesion inducing process. The cohesion inducing process (e.g., nanoparticle cohesion inducing process) includes treating (e.g., by applying heat, light, a physical mechanism or chemicals) the nanoparticle film, so that adjacent nanoparticles mutually cohere to a selected degree, which forms a cohered nanoparticle film. The cohered nanoparticles form a matrix in which the metallic particles are embedded, so that the distributor layer 134 includes a distributor material that includes a matrix of cohered nanoparticles and metallic particles embedded by the cohered nanoparticles.

In cohesion-inducing processes that include an application of heat, the degree of temperature applied can be selected as a function of the size of the nanoparticles to be cohered. Smaller nanoparticles can be heated at lower temperatures than larger nanoparticles so as to attain a selected degree of cohesion of the nanoparticles. The size and kind of nanoparticles included in the nanoparticle ink can be selected to induce (and maintain) cohesion at temperatures that are not likely to damage (or otherwise degrade) elements and structures of the integrated circuits of the wafer assembly 108.

In cohesion-inducing processes that include the application of light, a light source (e.g., incandescent light source) is configured to generate a radiant energy. The radiant energy can be applied to the non-cohered nanoparticle film over a heat profile (e.g., spike heating) in which relatively high temperatures are developed in a relatively short period of time in the irradiated surfaces of the wafer assembly 108. For example, the exposed surface of the wafer assembly 108 can be exposed to the radiant energy for a time period of 100 milliseconds to 5 seconds.

In cohesion-inducing processes that include the application of a physical mechanism to apply forces to the non-cohered nanoparticle film. The applied forces (e.g., applied pressure) can induce nanoparticle cohesion by inducing a diffusion of atoms between the adjacent nanoparticles and inducing atom-scale rise in temperatures between adjacent nanoparticles being forced together.

A second iteration of a nanoparticle film formation process for forming a distributor layer 134 can be employed (e.g., so as to form a thicker nanoparticle layer of uniform cohesion). In a second iteration of processing cycle for forming a distributor layer 134, a film of nanoparticle ink is deposited by a dispenser over the existing cohered nanoparticle film (and, optionally, over a selected portion of an exposed surface of the electrical insulator 132). The composition (e.g., size, types and relative amounts of nanoparticles) of the nanoparticle ink dispensed in a previous iteration can be different from the composition of the nanoparticle ink dispensed in a subsequent iteration.

After the deposition of nanoparticle ink film in the second iteration of the nanoparticle film formation process, the wafer assembly 108 can be heated by a bake process to remove at least a portion of a volatile material from the nanoparticle ink film deposited in the second iteration of the processing cycle.

After the deposition of nanoparticle ink film in the second iteration of the nanoparticle film formation process, the wafer assembly 108 can be treated by a cohesion inducing process. The cohesion inducing process induces cohesion between nanoparticles of the nanoparticle film formed in the second iteration and can induce cohesion between different nanoparticles of different sublayers. A selected degree of induced nanoparticle cohesion can be selected for a particular sublayer (e.g., such that sublayers can have differing degrees or types of cohesion) by varying the times and durations of selected temperatures of a heat treatment profile. Various characteristics (such as thickness, thermal conductivity and resistivity) of the distributor layer 134 can be controlled by controlling the parameters of the nanoparticle film formation process, as well as the total number of iterations of the nanoparticle film formation process.

The distributor layer 134 is an electrical conductor (so that electrons can readily flow through the distributor layer 134) and a thermal conductor (so that heat can be transferred from the electrical insulator 132 to the distributor layer 134 for radiation to an external environment). In an example, the distributor layer 134 can be electrically coupled to a power rail, which can reduce the incidence of potential failures from electromigration that can otherwise encountered when using narrow-aspect conductors for operating active circuits.

In an example, the distributor layer 134 is distributed over an area (e.g., footprint) that is larger than an area (e.g., in top view) in which the circuit elements 122 are formed. In an example, the distributor layer 134 has a heat conductivity rate that is higher than a heat conductivity rate of the semiconductor substrate 120A. The greater area of the distributor layer 134 and the greater heat conductivity rate of the distributor layer 134 facilitate removal of the heat generated by the circuit elements 122 (which, for example, lowers operating temperatures, decreases aging of transistor structures, decreases costs and conserves layout space of the circuit elements 122 on the semiconductor substrate 120A).

The glass carrier 126 can be removed (e.g., debonded) from the adhesion layer 124 (and the wafer assembly 108) by exposing the adhesion layer 124 to coherent light optically coupled through the glass carrier 126 to the adhesion layer 124. For example, the adhesion of the adhesion layer 124 can be reduced in response to the energy imparted to the adhesion layer 124 by the exposure to the coherent light.

Figure 1I:
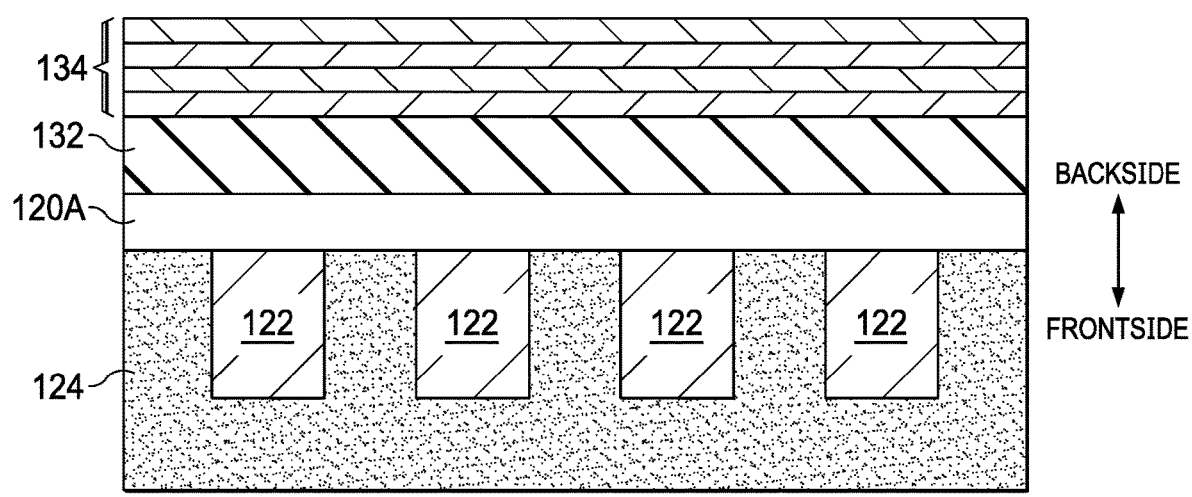
FIG. 1I is a section view of an example wafer assembly with the frontside glass carrier removed.

FIG. 1I is a section view of an example wafer assembly with the frontside glass carrier removed. For example, removing the glass carrier 126 from the wafer assembly 109 exposes the frontside of the adhesion layer 124 to allow access to the frontside of the wafer assembly for subsequent processing steps, such as planarizing, dicing and packaging of the wafer assembly 109.

Figure 1J:
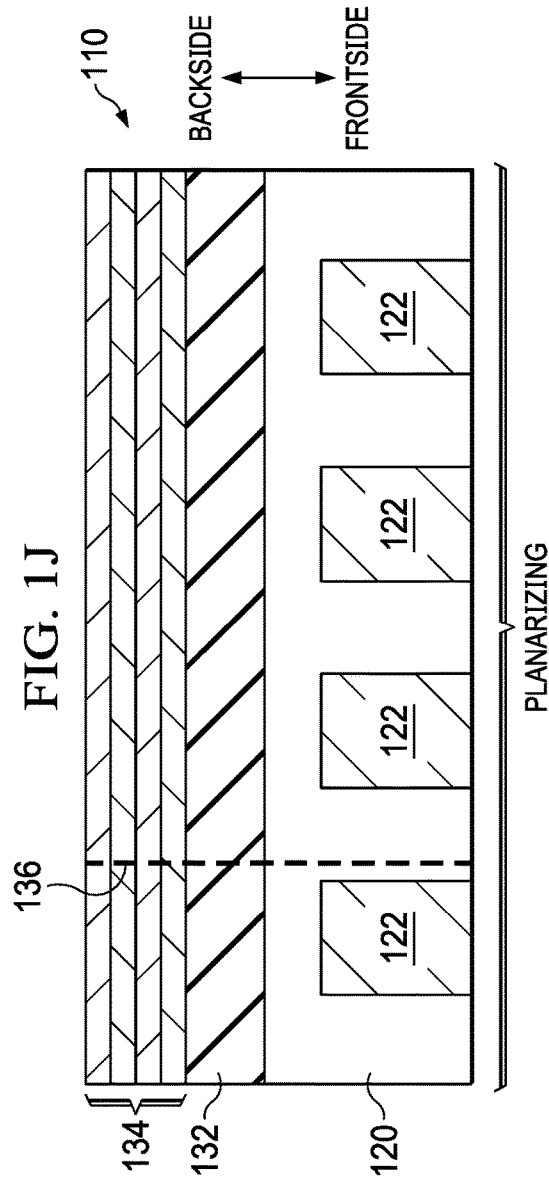
FIG. 1J is a section view of an example planarized wafer assembly having a sawlane.

FIG. 1J is a section view of an example planarized wafer assembly having a sawlane. For example, the wafer assembly 110 has been planarized, so that frontside portions of the adhesion layer 124 and the semiconductor substrate 120A are removed (e.g., so that a planar frontside surface having exposed portions of circuit elements 122 is formed). A sawlane 136 extends vertically through the wafer assembly 110 from backside to frontside. The wafer assembly 110 can be separated (e.g., diced by a saw) along the sawlane 136, so that at least two devices can be formed from the wafer assembly 110.

Figure 1K:
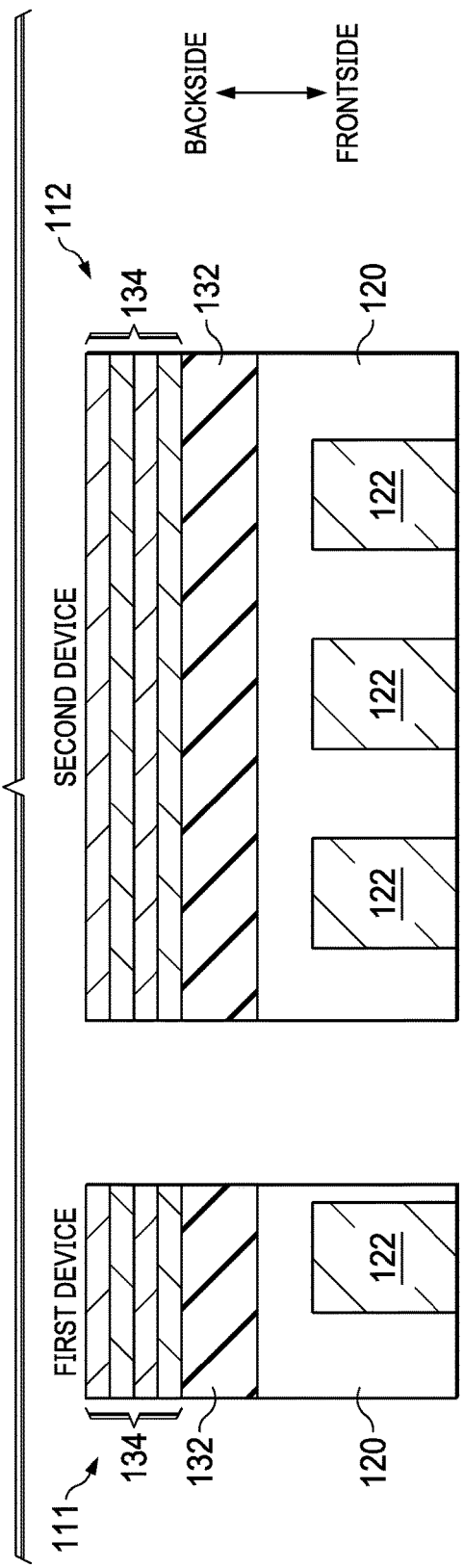
FIG. 1K is a section view of an example diced wafer assembly.

FIG. 1K is a section view of an example diced wafer assembly. For example, a first device (e.g., first die 111) and a second device (e.g., second die 112) can be formed by dicing the wafer assembly 110. The first die 111 and the second die 112 can be individually processed in subsequent processing steps (such as mounting or packaging steps), so that individual devices can be readily installed in various systems.

Figure 1L:
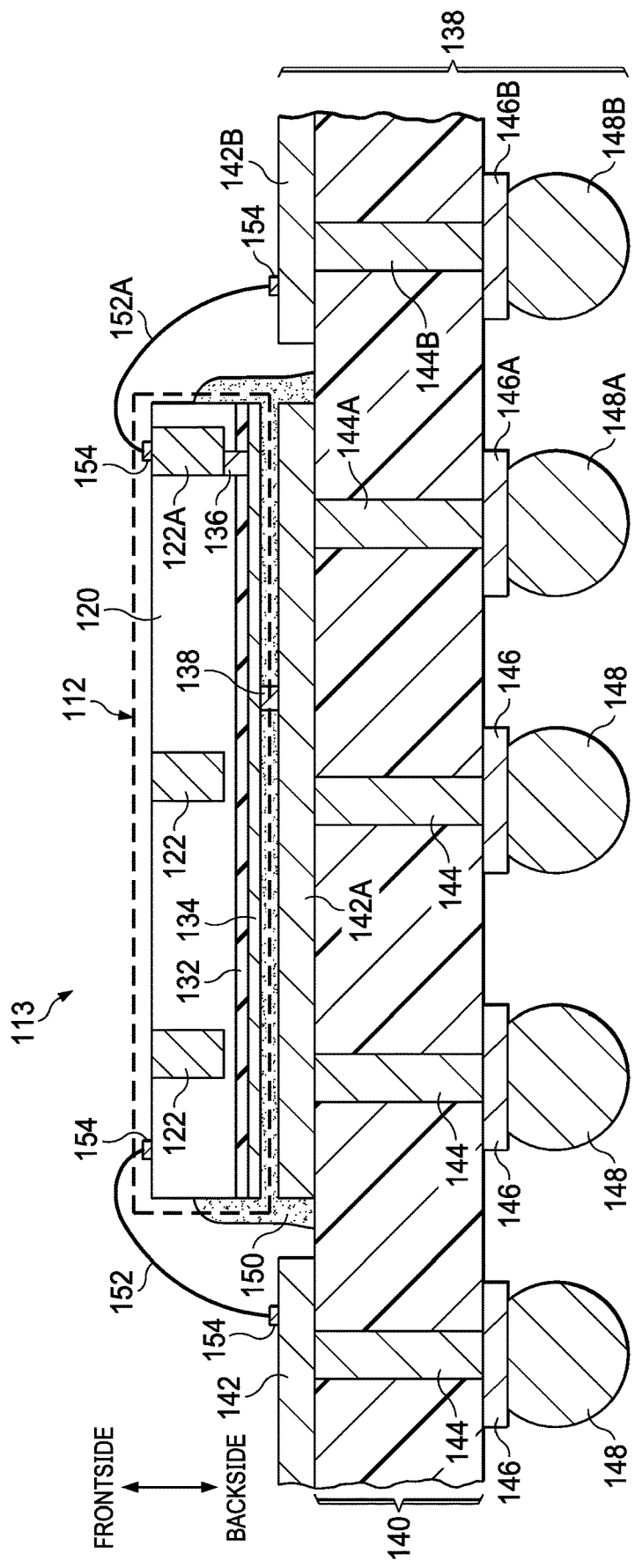
FIG. 1L is a section view of an example mounted die assembly.

FIG. 1L is a section view of an example mounted die assembly. For example, a mounted die assembly 113 can include the second die 112 (which can be a die singulated from the wafer assembly 110) mounted on a mounting substrate 138. The mounting substrate 138 includes a header 140 (which can include fiber reinforced plastic), top leads 142 (which can include copper), vias 144 (which can include copper) connected to the top leads 142, bottom leads 146 (which can include copper) connected to the vias 144, and solder balls 148 connected to the bottom leads 146.

Examples of mounting die assemblies are described in the commonly assigned U.S. Patent Application Publication US 2016/0093552, published Sep. 28, 2014, entitled Integration of Backside Heat Spreader for Thermal Management, the entirety of which is incorporated herein by reference.

The second die 112 is attached to the mounting substrate 138 with an electrically insulating die attach adhesive 150 (such as epoxy), which affixes the distributor layer 134 to a top leads 142 layer. Circuit elements 122 (such as components of electronic circuits) formed in the second die 112 substrate can be connected to the top leads 142 by wire bonds 152 arranged on the frontside surface of the second die 112.

In operation, circuit elements 122 of the second die 112 can potentially generate an amount of heat that can damage components of the second die 112 or otherwise decrease operating margins of the electronic circuits of the second die 112. The distributor layer 134 is arranged to conduct the heat away from the circuit elements 122, so that a temperature rise of circuit elements 122 is reduced (e.g., as compared against the greater temperature rise that can otherwise occur in a similar mounted die without a distributor layer 134 operating under similar conditions).

Figures 2, 3:
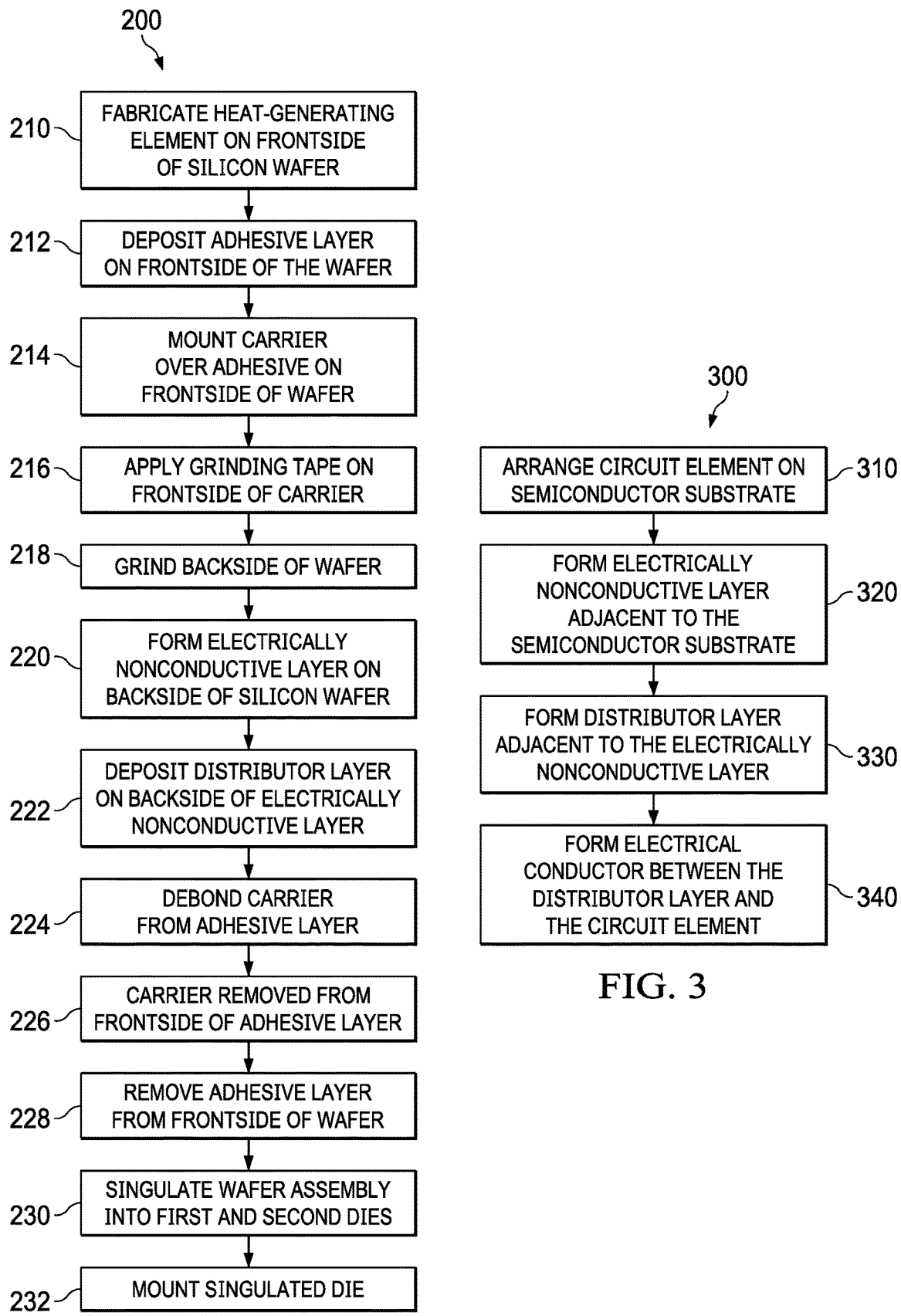
FIG. 2 is a flowchart of an example process for manufacturing devices that include an example distributor layer for backside heat removal.
FIG. 3 is a flowchart of an example process for manufacturing devices that include an example distributor layer for backside heat removal.

FIG. 2 is a flowchart of an example process for manufacturing devices that include an example distributor layer for backside heat removal. Certain operations of flow 200 can optionally be performed in an order other than the enumerated order. For example, operation 228 can be performed before operation 224.

The flow 200 begins at operation 210, which fabricates at least one circuit element on a frontside of a semiconductor substrate. For example, the circuit element can be any circuit element (e.g., 122) that can cause heating of the semiconductor substrate by dissipating electrical power or by conducting heat from other heat-generating devices. The semiconductor substrate can be, for example, formed from a semiconductor wafer. The semiconductor substrate has a frontside surface in (and/or on) which the circuit element can be formed (e.g., so that a wafer assembly having a circuit element is formed). The semiconductor substrate has a backside surface opposite the frontside surface.

At operation 212, an adhesion layer is deposited on the frontside of the semiconductor substrate. For example, the adhesion layer (e.g., 124) can be deposited to form a deformable surface on the frontside surface of the wafer assembly having a circuit element before the adhesive of the adhesion layer is cured. The adhesion layer has a first adhesion layer surface adjacent to the circuit element and the semiconductor substrate and has a second adhesion layer surface opposite the first adhesion layer surface.

At operation 214, a carrier is mounted over the second adhesion layer surface (e.g., the adhesive on the frontside of the semiconductor substrate). For example, the carrier (e.g., glass carrier 126) can be mounted by depressing the carrier into the frontside surface of the adhesion layer. The deformable surface of the adhesive conforms to a planar surface of carrier, so that an optimal contact area is formed. The adhesive can be cured (e.g., to increase adhesion) by exposure to heat and/or light (e.g., light transmitted through glass of the carrier).

At operation 216, grinding tape is applied to the frontside of the carrier. For example, the grinding tape (e.g., 11 can be a double-sided adhesive tape for temporarily securing the wafer assembly to a workplace fixture (e.g., so that a process such as grinding can be performed on the wafer assembly without moving the wafer assembly during the process). The adhesion of the tape can be decreased in subsequent processing steps, for example, by exposure of the grinding tape to ultraviolet (UV) light.

At operation 218, the backside of the semiconductor substrate can be ground. For example, a grinding (including hydrofluoric- or nitric acid-based etching) process step can be applied to reduce the thickness of the backside of the semiconductor substrate (e.g., to a circuit element). The semiconductor substrate can be back-grinded to a thickness of 100-50 microns (or less), for example. Reducing the thickness of the semiconductor substrate increases the thermal conduction of the semiconductor substrate, so that heat is more effectively transferred from frontside circuit elements of the wafer assembly to the backside of the wafer assembly. Reducing the thickness of the semiconductor substrate also allows that production of dies that include reduced-thickness semiconductor substrates to be used electronic devices that include reduced-thickness formfactors (such as cellphones and computer tablets).

At operation 220, an electrical insulator layer (e.g., electrically insulating layer) is formed on the backside of the semiconductor substrate. For example, an electrical insulator layer (e.g., 132) can be formed over (e.g., deposited adjacent to) the backside of the semiconductor substrate. The electrical insulator layer has a first electrical insulator layer surface adjacent to the backside surface and has a second electrical insulator layer surface opposite the first electrical insulator layer surface. In one example, the electrical insulator layer can be a dielectric material, such as silicon dioxide. The silicon dioxide can be deposited by a chemical vapor deposition process step, so that the electrical insulator layer has a thickness of 50 microns in one example.

At operation 222, a distributor layer (e.g., thermally conductive layer) is formed on the backside of the electrical insulator layer. For example, a distributor layer (e.g., 134) can be formed over (e.g., deposited adjacent to) second layer of the second electrical insulator layer surface. The distributor layer has a first distributor layer surface adjacent to the second electrical insulator layer surface and has a second distributor layer surface opposite the first distributor layer surface. In one example, the distributor layer can be a nanoparticle layer, which includes nanoparticles such as graphene. The distributor layer can include an in-plane thermal conductivity of at least 150 watts/(meter×° K) and an electrical resistivity of less than 100 micro-ohm-centimeters. The distributor layer can include a distributor material 100 nanometers to 5 microns thick that includes a matrix of cohered (at least partly cohered) nanoparticles (e.g., graphitic platelets) and metallic particles. The formation of the distributor layer is described hereinbelow with reference to FIG. 4, for example.

At operation 224, the carrier is debonded from the adhesion layer. For example, the carrier (e.g., glass carrier 126) can be removed (e.g., debonded) from the adhesion layer (e.g., 124) by exposing the adhesion layer to coherent light optically coupled through the carrier. For example, the adhesion of the adhesion layer can be reduced when the adhesion layer is exposed to the coherent light. Reducing the adhesion of the adhesion layer facilitates, for example, the debonding (e.g., delamination) of the carrier from the adhesion layer.

At operation 226, the carrier is removed from the adhesion layer. For example, the carrier (e.g., glass carrier 126) is removed from the adhesion layer (e.g., 124), so that the frontside surface of the adhesion layer is exposed. The adhesion layer can be removed as described hereinbelow.

At operation 228, the adhesion layer is removed from the frontside of the semiconductor substrate. For example, the adhesion layer (e.g., 124) can be removed by a grinding process iteratively applied to remove the adhesion layer. The grinding process can be continued, so that the frontside surface of the wafer assembly and the frontside surfaces of the circuit elements are exposed on the wafer assembly.

At operation 230, the wafer assembly is singulated into first and second dies. For example, the wafer assembly can be singulated by laser-cutting, sawing, jetting, etching, and/or scribing and flexing the wafer assembly along a sawlane (e.g., 136) that extends (notionally extends) vertically through the wafer assembly (e.g., 110) from backside to frontside. The wafer assembly can be singulated by processing the wafer assembly: from the frontside along the sawlane; from the backside along the sawlane; or from the frontside and backside along the sawlane. When singulated, the wafer assembly can be physically separated so that devices (e.g., at least two devices) previously formed on the wafer assembly can be separately mounted (e.g., packaged).

At operation 232, a singulated die is mounted. For example, the die (e.g., the second die 112) can be mounted on a mounting substrate (and/or package). The die can be mounted the mounting substrate surface (e.g., with a die attach adhesive disposed therebetween) of the mounting substrate (e.g., 138). The die attach adhesive has a first die attach layer surface adjacent to the second distributor layer surface of the die and has a second die attach surface opposite the first die attach surface. The die attach adhesive is a material such as epoxy and is electrically insulating. The die attach adhesive is disposed between a backside surface of the die (e.g., distributor layer 134) and an upper surface (e.g., upper surface of top leads 142) of the mounting substrate. The disposed die attach adhesive has a first die attach layer surface adjacent to the second distributor layer surface and has a second die attach surface opposite the first die attach surface. The die attach adhesive can be cured (e.g., accelerated) by exposure to UV light.

The mounting substrate has a first mounting substrate surface (e.g., that includes structures formed on the mounting substrate) adjacent to the second adhesion layer surface. Bonding wires (e.g., 152 and/or 152A) can be attached at the frontside surface and attached at the mounting substrate surface.

The mounting substrate has a second mounting substrate surface that is opposite to the first mounting substrate surface. The mounting substrate includes a bottom lead (e.g., 146A) at the second mounting substrate surface. The bottom lead can be electrically coupled to the distributor layer (e.g., 134) by a via (e.g., 144A), a top lead (e.g., 142A) and a contact (e.g., 137). The distributor layer can be coupled to conduct power (e.g., conduct electricity) to the circuit element by a through-silicon via (e.g., 136).

FIG. 3 is a flowchart of an example process for manufacturing devices that include an example distributor layer for backside heat removal. Certain operations of flow 300 can optionally be performed in an order other than the enumerated order. For example, operation 340 can be performed before operation 330.

The flow 300 begins at operation 310, which arranges a circuit element on a frontside of a semiconductor substrate. For example, the circuit element can be a device such as a transistor, diode and/or a resistor. At least one circuit element can be arranged by forming and/or mounting the circuit element in, on and/or through a frontside of the semiconductor substrate. In one example, a through-silicon via (TSV) can extend from the circuit element, extend through the frontside surface of the semiconductor substrate and extend to a backside surface of the semiconductor substrate that is opposite to the frontside surface of the semiconductor substrate.

At operation 320, an electrical insulator layer is formed adjacent to the semiconductor substrate. For example, the electrical insulator layer can be formed (e.g., deposited, grown, sputtered, positioned, mounted or otherwise arranged) adjacent to the backside surface of the semiconductor substrate. The electrical insulator layer includes a first electrical insulator layer surface adjacent to the backside surface and includes a second electrical insulator layer surface opposite the first electrical insulator layer surface.

At operation 330, a distributor layer is formed adjacent to the electrical insulator layer. For example, the distributor layer can be formed adjacent to the second electrical insulator layer surface. The distributor layer can include a distributor material that is 100 nanometers to 5 microns thick and that can include a matrix of cohered nanoparticles (e.g., cohered graphitic platelets) and metallic particles embedded by the cohered nanoparticles. The distributor layer can be formed by a plasma enhanced chemical vapor deposition (PECVD) process. The PECVD process can include methane and hydrogen for forming the graphitic platelets. The graphitic platelets can include carbon-based nanoparticles such as graphene. The metallic particles can include: the element silver (Ag), molecules that include the element Ag; aggregates that include the element Ag; and/or any of various compounds or substances that include the element Ag. A process for forming the distributor layer is described hereinbelow with reference to FIG. 4.

At operation 340, an electrical conductor is formed between the distributor layer and the circuit element. For example, an electrical conductor can be formed between the distributor layer and the circuit element, so that power is coupled to (e.g., current and/or voltage is coupled to or from) the circuit element. In one example, a first power rail can be formed to include an electrical path that extends through a solder ball (e.g., 148A), a bottom lead (e.g., 146A), a via (e.g., 144), a top lead (e.g., 142A), a contact (e.g., 137) and a through-silicon via (e.g., 136) to the circuit element. A second power rail can be formed to include an electrical path that extends through solder ball (e.g., 148B), a bottom lead (e.g., 146B), a via (e.g., 144), a top lead (e.g., 142B), a bonding wire (e.g., 152A) and a metallization segment (e.g., 154) to the circuit element. In another example, a first power rail can couple power from a bonding wire (e.g., 152) through the distributor layer to a circuit element (e.g., 122A), and a second power rail can couple power from the circuit element through a metallization segment (e.g., 154) to a bonding wire (e.g., 152A). Accordingly, power can be applied to terminals (e.g., 148A and 148B) for coupling power to the circuit element through an electrical path that includes the distributor layer.

Figure 4:
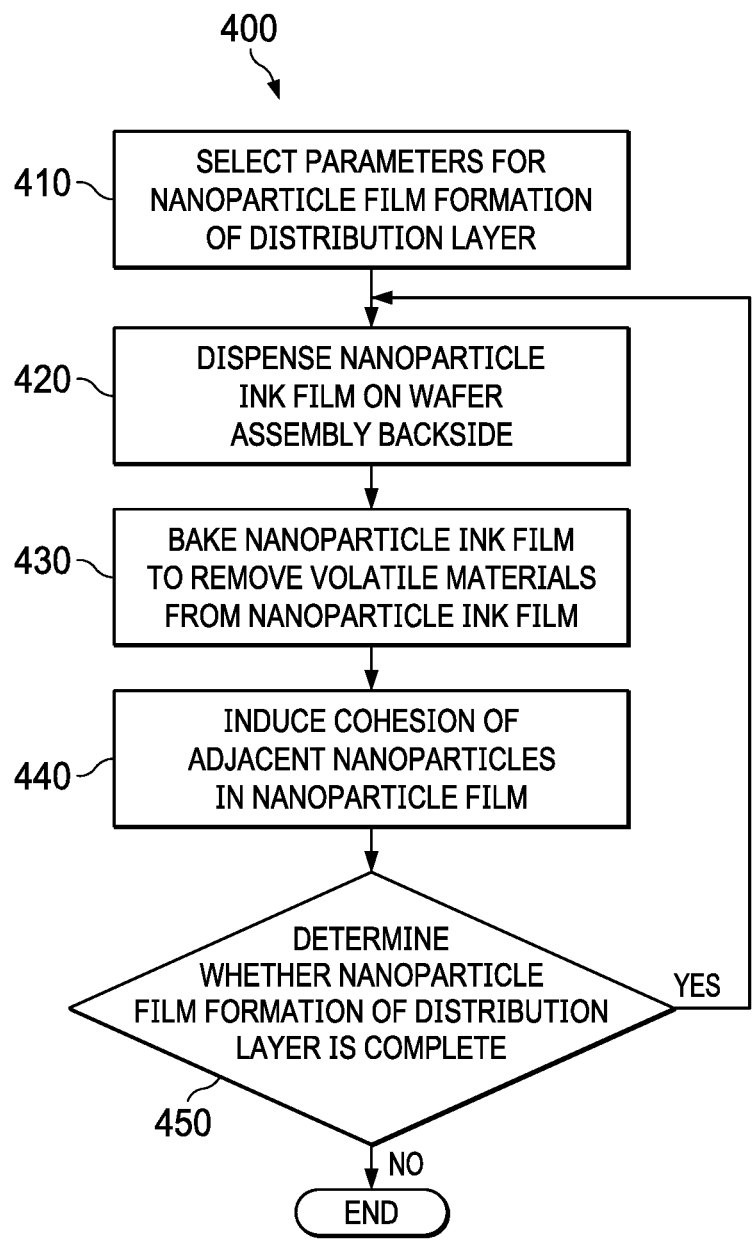
FIG. 4 is a flowchart of an example process for forming an example distributor layer for backside heat removal.

FIG. 4 is a flowchart of an example process for forming an example distributor layer for backside heat removal. Certain processes of flow 400 can optionally be performed in an order other than the enumerated order. For example, operational parameters can be selected at any point in the process (e.g., at any point before an operation is performed responsive to a selected parameter).

The flow 400 begins at process 410, in which parameters of nanoparticle film formation process for forming a distributor layer 134 adjacent to a backside of a wafer assembly (e.g., backside of the semiconductor substrate or backside of an electrical insulator layer) are selected. For example, such selectable parameters include: a pattern for the coverage area of the nanoparticle film deposition; the thicknesses of the various sublayers (by which the distributor layer 134 is formed); the number of iterations of processes 420, 430 and 440; the composition of a nanoparticle ink for forming a respective sublayer; the duration and temperature(s) applied for baking (e.g., removing volatile materials from the nanoparticle ink); and the duration and temperatures applied for cohering the selected nanoparticle size and types of a respective sublayer.

At process 420, a film of nanoparticle ink is deposited by a dispenser over an existing surface of a backside of a wafer assembly. The film of nanoparticle ink can be deposited over a portion of a previously dispensed nanoparticle film or over a selected portion of an exposed surface of the electrical insulator 132. The composition (e.g., size, types and relative amounts of nanoparticles) of the nanoparticle ink dispensed and amount dispensed to form a nanoparticle film of a selected depth is performed responsive to parameters having values, for example, selected at process 410. A nanoparticle ink film is formed responsive to the deposition of the nanoparticle ink.

At process 430, the deposited film of nanoparticle ink on an existing surface of a backside of a wafer assembly is baked (e.g., by an oven, hot plate or radiant heat/light) to remove at least a portion of a volatile material from the deposited nanoparticle ink film. A nanoparticle film is formed responsive to the baking of the nanoparticle ink film.

At process 440, the nanoparticle film of the backside of the wafer assembly is irradiated (e.g., heated) to induce cohesion between adjacent nanoparticles of the nanoparticle film and to induce cohesion between adjacent nanoparticles of the nanoparticle films between adjacent sublayers. A cohered nanoparticle film is formed responsive to the induced cohesion of the nanoparticle film.

At process 450, a determination of whether the selected number of iteration of processes 420, 430 and 400 has been performed (and/or whether the distributor layer that comprises the aggregated cohered nanoparticle films has been formed to a selected thickness). In response to a positive determination, the processing is terminated; in response to a negative determination, processing continues at process 420.

Modifications are possible in the described embodiments, and other embodiments are possible, within the scope of the claims.

What is claimed is:

1. A circuit comprising:
   a semiconductor substrate including a frontside surface and a backside surface;
   a circuit element at the frontside surface;
   a distributor material over the backside surface of the semiconductor substrate, the distributor material including a matrix of cohered nanoparticles and metallic particles embedded by the cohered nanoparticles; and
   an electrical insulator layer between the backside surface of the semiconductor substrate and the distributor material.

2. The circuit of claim 1, wherein the distributor material has an in-plane thermal conductivity of at least 150 watts/(meter×® K), and wherein the distributor material has an electrical resistivity of less than 100 micro-ohm-centimeters.

3. The circuit of claim 1, the electrical insulator layer contains a via having a first end and a second end, the first end contacting the circuit element, and the second end contacting the distributor material.

4. The circuit of claim 1, wherein the backside surface is less than 100 microns from the circuit element.

5. The circuit of claim 4, wherein the cohered nanoparticles include graphitic platelets.

6. The circuit of claim 4, wherein the metallic particles include silver (Ag).

7. The circuit of claim 1, wherein the distributor material is coupled to conduct electricity.

8. The circuit of claim 1, wherein the distributor material is coupled to conduct power to the circuit element.

9. The circuit of claim 8, wherein the electrical insulator layer includes boron nitride (BN).

10. The circuit of claim 9, comprising bonding wires attached at the frontside surface.

11. A circuit comprising:
   a semiconductor substrate including a frontside surface and a backside surface;
   a circuit element arranged on the semiconductor substrate;
   an electrical insulator layer having a first electrical insulator layer surface over the backside surface and having a second electrical insulator layer surface opposite the first electrical insulator layer surface;
   a distributor material having a first distributor material surface over the second electrical insulator layer surface and having a second distributor material surface opposite the first distributor material surface, wherein the distributor material includes a matrix of cohered nanoparticles and metallic particles embedded by the cohered nanoparticles;
   an adhesion layer having a first adhesion layer surface over the second distributor material surface and having a second adhesion layer surface opposite the first adhesion layer surface; and
   a mounting substrate having a mounting substrate surface over the second adhesion layer surface.

12. The circuit of claim 11, comprising a bonding wire attached at the frontside surface and attached at the mounting substrate surface.

13. The circuit of claim 12, wherein the mounting substrate surface is a first mounting substrate surface and the mounting substrate has a second mounting substrate surface that is opposite to the first mounting substrate surface; and comprising a lead at the second mounting substrate surface.

14. The circuit of claim 13, wherein the lead is electrically coupled to the distributor material through the mounting substrate and through the adhesion layer.

15. The circuit of claim 14, wherein the electrical insulator layer contains a via having a first end and a second end, the first end contacting the circuit element, and the second end contacting the distributor material.

16. A method, comprising:
   forming a circuit element at a frontside surface of a semiconductor substrate, wherein the frontside surface is opposite to a backside surface of the semiconductor substrate;
   forming an electrical insulator layer over the backside surface of the semiconductor substrate; and
   layering a distributor material over the electrical insulation layer, wherein the distributor material includes a matrix of cohered nanoparticles and metallic particles embedded by the cohered nanoparticles.

17. The method of claim 16, wherein the distributor material is layered by a PECVD process (a plasma enhanced chemical vapor deposition process), wherein the PECVD process includes methane and hydrogen for forming nanoparticles of the matrix, and wherein the distributor material that is 100 nanometers to 5 microns thick.

18. The method of claim 17, further comprising forming a via through the electrical insulator layer and into the backside surface of the semiconductor substrate, the via having an end contacting the distributor material.

19. The method of claim 16, wherein the metallic particles include silver (Ag).

20. The method of claim 16, further comprising forming an electrical conductor between the distributor material and the circuit element.

* * * * *